United States Patent [19]

Chanteau

[11] Patent Number: 5,408,207

[45] Date of Patent: Apr. 18, 1995

[54] ELECTRONIC DEVICE FOR HIGH FREQUENCIES COMPRISING A PRINTED CIRCUIT AND PROCESS FOR MANUFACTURING SUCH A CIRCUIT

[75] Inventor: Pierre Chanteau, La Haye Malherbe, France

[73] Assignee: U.S. Philips Corporation, New York, N.Y.

[21] Appl. No.: 115,336

[22] Filed: Sep. 1, 1993

[30] Foreign Application Priority Data

Sep. 2, 1992 [FR]  France ................................. 92 10480

[51] Int. Cl.⁶ .............................................. H01P 1/00
[52] U.S. Cl. ...................................... 333/246; 29/840; 361/753
[58] Field of Search ........................ 333/204, 238, 246; 29/840; 361/753, 758, 799

[56] References Cited

U.S. PATENT DOCUMENTS

| | | | |
|---|---|---|---|
| 2,721,312 | 10/1955 | Grieg et al. | 333/238 |
| 3,621,478 | 11/1971 | Johnson et al. | 333/238 X |
| 4,184,133 | 1/1980 | Gehle | 333/238 |
| 5,319,329 | 6/1994 | Shiau et al. | 333/204 |

FOREIGN PATENT DOCUMENTS 0222445  5/1987  European Pat. Off. .
221002  12/1984  Japan ................................. 333/238

*Primary Examiner*—Paul Gensler
*Attorney, Agent, or Firm*—Ernestine C. Bartlett

[57] ABSTRACT

A printed circuit board carrying active and/or passive components and provided with high-frequency lines is mounted parallel to a ground plane (4) of the housing. The printed circuit board is a single-sided one whose rear surface (11) without metallization is joined to the ground plane (4) of the housing, while spacer blocks are provided for maintaining a spacing between the rear surface (11) and the ground plane (4).

9 Claims, 1 Drawing Sheet

ELECTRONIC DEVICE FOR HIGH FREQUENCIES COMPRISING A PRINTED CIRCUIT AND PROCESS FOR MANUFACTURING SUCH A CIRCUIT

BACKGROUND OF THE INVENTION

The invention relates to an electronic device for frequencies of up to two gigahertz comprising a housing containing a printed circuit, possibly with connected active and/or passive components, which printed circuit is provided with metallized tracks forming electric connecting lines which are mounted parallel to an electrically conducting plate which serves as a ground plane.

It also relates to a process for manufacturing such a device.

Such a device is used particularly for circuits for the distribution of cable television in which the signals, including those of satellite TV signals, have frequencies in the medium frequency band, of between 40 and 2050 mHz.

A device comprising electric lines mounted parallel to an electrically conducting plate is known from the document EP-A 0 222 445. The ground plane according to this document is formed in usual manner by a metallization on the rear surface of the printed circuit board. With such a device, the electric field of the line develops mainly in the material of the printed circuit board, which leads to losses and excessive mismatches at high frequencies owing to quality defects and irregularities of this material, unless a material of very high quality is used, which would be expensive.

SUMMARY OF THE INVENTION

The invention has for its object to provide a device which shows a good performance as regards losses and impedance matching, while standard materials and conventional mechanical elements are used.

It is based on the idea that the dielectric material of the printed circuit board (with a constant dielectric value and high loss factor) can be connected in series with a thin air gap (with a loss factor of almost zero) in such a manner that the interposition of the latter is important but that nevertheless the capacitance between the connecting lines and earth is strong enough for the characteristic impedance of the connecting lines to be maintained without the necessity of unduly increasing the dimensions of these lines.

According to the invention, such a device is characterized in that, the components are of the surface mounted type and the printed circuit are of the single-sided type with the metallization only on one surface, the so-called front surface, while the other or rear surface is not metallized, the rear surface of the printed circuit board is mechanically coupled to the electrically conducting plate, and the electrically conducting plate is a plane wall of the housing, while means are provided for maintaining an air gap between the rear surface and the said wall.

Another advantage of the device according to the invention compared with a device comprising an earth metallization at the back of the printed circuit board is that the single-sided circuit is cheaper than the double-sided circuit.

An accompanying advantage is that, given a certain thickness of the substrate of the printed circuit, the inductances printed on the circuit board have a higher natural resonance frequency and a better Q factor for the same self-inductance value.

Advantageously, the housing having the shape of a comparatively flat parallelepiped, i.e. one of which two opposed surfaces are larger than the others, the said plane wall is situated in the interior of the housing in a substantially central position between the two largest surfaces.

DETAILED DESCRIPTION OF THE INVENTION

Figure 1:
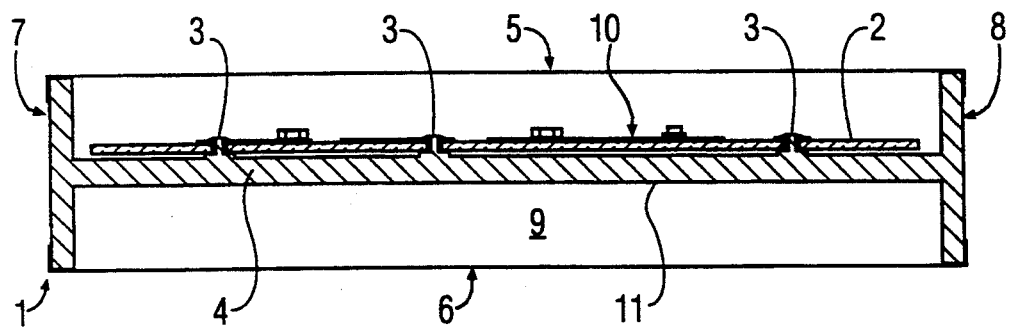
FIG. 1 is a cross-section of a housing containing a printed circuit board according to the invention.

When a standard printed circuit board is used with a practical thickness of 1.6 mm, the said air gap advantageously lies between 0.2 and 0.6 mm.

This value for the air gap represents a good compromise between all the more or less contradictory requirements which obtain: if the air gap is too narrow, the material of the printed circuit board is predominant and the dielectric quality is bad, while in addition the spread in the value of the air gap is too great, and if the air gap is wide, the lines have to be bigger and the overall dimension of the circuit is too great.

To maintain a spacing between the said rear surface and the said wall, the latter is advantageously provided with spacer blocks each formed by a base against which the printed circuit board is applied and a pin whose cross-section is smaller than that of the base and which is passed through a hole in the printed circuit.

The mechanical assembly is thus assured in a simple and inexpensive manner.

The printed circuit board is provided with metallized pads around holes destined for accommodating the spacer blocks, which facilitates a simple fixation of the printed circuit board on the said wall of the housing through soldering of the circuit to the spacer blocks, while at least some of these metallized pads are connected to points of the electric circuit board formed by the metallized tracks of the printed circuit which must be connected to earth. Thus the fixation of the circuit by soldering renders it possible at the same time to provide the earthing.

An advantageous process for manufacturing an electronic device in which the printed circuit is fixed on spacer blocks through soldering and supports components of the surface mounted type is characterized by the following sequence of operations:

- the printed circuit is provided with soldering paste at locations where components are to be mounted and also around holes provided for the passage of the spacer blocks,
- the components are positioned on the pads provided with the paste,
- the printed circuit is positioned in the housing,
- finally, the components are soldered to the printed circuit and the printed circuit is soldered to the spacer blocks in a single operation.

These and other aspects of the invention will be described in more detail with reference to the figures of the drawing and the following description of a non-limitative example of an embodiment.

The electronic device shown in FIG. 1 comprises a housing 1 having the shape of a comparatively flat parallelepiped. Two opposed surfaces, called "upper" and "lower" surface, which are perpendicular to the plane of the drawing and whose profiles are referenced 5 and 6, are larger than the other surfaces, i.e. than the "short sides" 7, 8 and the "long sides" of which only a reference numeral 9 is visible. A plane wall 4 or "floor" (perpendicular to the plane of the drawing) is situated inside the housing in a substantially central position between the two major surfaces 5 and 6. This housing is, for example, moulded from an alloy of aluminium and zinc known as "ZAMAC", and tin-plated. The surfaces 5 and 6 are made of tinned iron.

A printed circuit board 2 of resin-bonded paper (for example, conforming to the type PF-CP02 according to standard DIN 40802), with a thickness, for example, of 1.6 mm, and having a single-sided printed surface, i.e. with metallizations on one surface 10, the front surface, while the other or rear surface 11 is not metallized is arranged on the wall 4. This printed circuit board is fixed on spacer blocks 3 which are cast integrally with the wall 4 and are tin-plated electrolytically along with the latter. These spacer blocks maintain an air gap between the rear surface of the printed circuit board and the wall 4.

Figure 2:
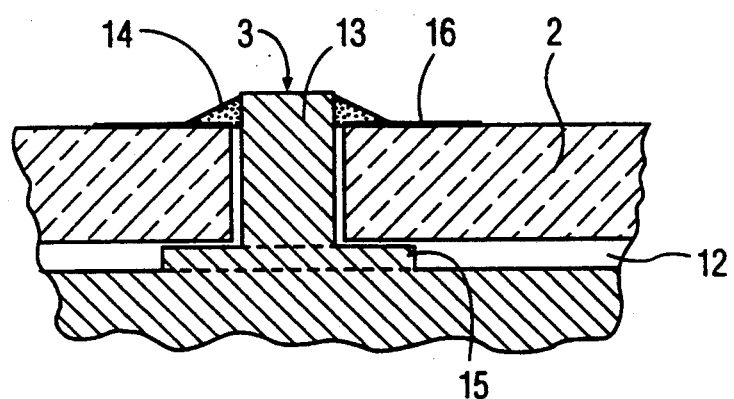
FIG. 2 is a cross-section in an enlarged scale of a spacer block for fixing the printed circuit board in the housing.

FIG. 2 shows one of these spacer blocks. It is formed by a base 15 against which the printed circuit board is applied and by a pin 13 which is thinner than the base and which is passed through the printed circuit board. The pin 13 renders it possible to hold the printed circuit board while the base 15 defines an air gap 12. The base 15 preferably has a thickness of 0.4 mm, thus providing an air gap 12 of 0.4 mm. This air gap may obviously have different values, but it will advantageously lie between 0.2 and 0.6 mm. The diameter of the pins is, for example, 1.3 mm. It is advisable to provide the spacer blocks fairly close together so as to avoid the printed circuit board bending between two spacer blocks, which would change the value of the air gap. This will not present problems in any case because the number of points of the circuit to be connected to earth is generally comparatively great, which necessitates the presence of a great number of spacer blocks.

For its fixation in the housing, the printed circuit board 2 is provided with annular metallized pads 16 around holes provided for the passage of the spacer block pins and is soldered to the pins in these locations by means of a solder fillet 14. At least some of these annular pads are connected to points of the electric circuit, formed in particular by metallized tracks of the printed circuit board, which are to be connected to earth.

The soldering in question may be carried out by a soldering robot which would perform a final operation after mounting in the housing of a finished circuit, i.e. with all its final components already mounted. A favorable process which reduces the number of operations for realizing an electronic device according to the above description, however, in which the printed circuit supports surface mounted components, comprises the following steps:

first the printed circuit is provided with soldering paste, for example, by silk-screen printing whereby paste is deposited selectively in locations where components are to be mounted, i.e. in locations where metallized portions of the components to be soldered are going to be placed, and in the same silk-screen printing operation, paste is also deposited around holes provided for the passage of the spacer block pins on the annular metallized pads provided in these locations on the printed circuit, then the components are mounted on the locations provided with paste, the printed circuit is positioned in the housing, finally, the components are soldered to the printed circuit and the printed circuit is soldered to the spacer blocks in a single operation, for example, by soldering in the vapour phase, or by heating in an oven.

A comparison of the performance of a circuit as described above with that of a similar circuit but then directly provided on the wall 4, taking into account manufacturing variations for all dimensions (thickness of printed circuit, of air gap, widths of conductor tracks), as well as in the dielectric constant and the loss factor of the material of the printed circuit, shows that the advantage is a major one: in a particular case taken by way of example, it is found that at 2 GHz the losses are three times smaller than for a line of the same impedance realized on a printed circuit provided directly on the wall. The variations in the characteristic impedance value of fine connecting lines (characteristic impedance 135 Ω) which serve to realize the inductances are found to be equal to 4.4%, against 8.2% for a printed circuit provided directly on the wall. The advantage derived from the invention, as regards the variations, is more important in proportion as the impedance of the printed connecting line is higher. This is particularly advantageous when fixed filters are to be made by means of printed inductances, the self-inductance value of which depends on the characteristic impedance.

I claim:

1. An electronic device for frequencies of up to two gigahertz comprising a housing (1) containing a printed circuit board (2), with connected components which printed circuit board is provided with metallized tracks forming electric connecting lines which are mounted parallel to an electrically conducting plate which serves as a ground plane, characterized in that, the said components are of the surface mounted type and the printed circuit board (2) is of the single-sided type with the metallizations on one surface, the front surface (10), while the other or rear surface (11) is not metallized, the rear surface (11) of the printed circuit board is mechanically coupled to the electrically conducting plate, the housing has the shape of a parallelepiped of which two opposing surfaces (5, 6) are larger than the others, the electrically conducting plate is a plane wall (4) situated in the interior of the housing in a substantially centered position between the two largest surfaces (5, 6) and means are provided for maintaining an air gap (12) between the rear surface (11) and the plane wall (4).

2. An electronic device as claimed in claim 1, characterized in that the printed circuit board (2) has a thickness of about 1.6 mm, and the said air gap (12) has a thickness of between 0.2 and 0.6 mm.

3. An electronic device as claimed in claim 1 wherein to maintain an air gap between the said rear surface and the said wall, the latter is provided with spacer blocks formed by a base against which the printed circuit board is applied and a pin whose cross-section is smaller than that of the base and which is passed through a hole in the printed circuit board.

4. An electronic device as claimed in claim 2 wherein to maintain an air gap between the said rear surface and the said wall, the latter is provided with spacer blocks formed by a base against which the printed circuit board is applied and a pin whose cross-section is smaller than that of the base and which is passed through a hole in the printed circuit board.

5. An electronic device for frequencies of up to two gigahertz comprising a housing (1) containing a printed circuit board (2) with connected components, which printed circuit board is provided with metallized tracks forming electric connecting lines which are mounted parallel to an electrically conducting plate which serves as a ground plane, characterized in that the said components are of the surface mounted type and the printed circuit board (2) is of the single-sided type with the metallizations on one surface, the front surface (10), while the other or rear surface (11) is not metallized, the rear surface (11) of the printed circuit board is mechanically coupled to the electrically conducting plate, which plate is a plane wall (4) of the housing and an air gap (12) is provided between the rear surface and the said plane wall (4) by spacer blocks (3) provided on said plane wall (4), which spacer blocks (3) are formed of a base (15) against which the printed circuit board is positioned and a pin (13) whose cross-section is smaller than that of said base and which is passed through a hole in the printed-circuit board.

6. An electronic device as claimed in claim 5, characterized in that the printed circuit board (2) is provided with metallized pads (16) around the holes provided for the passage of the spacer blocks and is soldered to these blocks.

7. An electronic device as claimed in claim 6, characterized in that at least some of the said metallized pads (16) are connected to points of the electric circuit, formed by the metallized tracks of the printed circuit, which are to be connected to earth.

8. A process for the production of an electronic device as claimed in claim 7 in which the printed circuit board supports components of the surface mounted type, characterized by the following sequence of operations:
the printed circuit board is provided with soldering paste at locations where components are to be mounted and also around holes provided for the passage of the spacer blocks,
the components are positioned on the pads provided with the paste,
the printed circuit board is positioned in the housing,
finally, the components are soldered to the printed circuit board and the printed circuit is soldered to the spacer blocks in a single operation.

9. A process for the production of an electronic device as claimed in claim 6, in which the printed circuit board supports components of the surface mounted type, characterized by the following sequence of operations:
the printed circuit board is provided with soldering paste at locations where components are to be mounted and also around holes provided for the passage of the spacer blocks,
the components are positioned on the pads provided with the paste,
the printed circuit board is positioned in the housing,
finally, the components are soldered to the printed circuit board and the printed circuit board is soldered to the spacer blocks in a single operation.

* * * * *